United States Patent
Strom et al.

(10) Patent No.: US 11,750,180 B2
(45) Date of Patent: Sep. 5, 2023

(54) HIGH FREQUENCY AC COUPLED SELF-BIASED DIVIDER

(71) Applicant: International Business Machines Corporation, Armonk, NY (US)

(72) Inventors: James Strom, Rochester, MN (US); Grant P. Kesselring, Rochester, MN (US); Andrew D. Davies, Rochester, MN (US); Ann Chen Wu, Hopewell Junction, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 17/469,402

(22) Filed: Sep. 8, 2021

(65) Prior Publication Data
US 2023/0073824 A1   Mar. 9, 2023

(51) Int. Cl.
*H03K 5/01*   (2006.01)
*G06F 1/08*   (2006.01)

(52) U.S. Cl.
CPC .................... *H03K 5/01* (2013.01); *G06F 1/08* (2013.01)

(58) Field of Classification Search
CPC ........ H03K 5/01; H03K 3/0315; H03K 5/135; H03K 5/1565; G06F 1/08; G06F 1/10; G06F 1/06; H03L 7/00; H03L 7/24; H03L 1/00; H03L 7/0812; H03L 7/10; H03L 7/23; H03L 7/085; H03L 7/08; H03L 7/06; H03L 7/087; H03L 7/093; H03L 7/18; H03L 7/099; H03L 7/0891; H03L 7/0995; H04L 7/033; H03B 5/1212; H03B 27/00; H03B 5/1228; H03B 5/1215
See application file for complete search history.

(56) References Cited

U.S. PATENT DOCUMENTS

| | | | |
|---|---|---|---|
| 5,091,706 A | 2/1992 | Lautzenhiser |
| 5,179,731 A | 1/1993 | Trankle et al. |
| 5,491,441 A | 2/1996 | Goetschel et al. |
| 7,425,850 B2 | 9/2008 | Widerin |
| 8,023,591 B2 | 9/2011 | Hafizi |

(Continued)

FOREIGN PATENT DOCUMENTS

| | | |
|---|---|---|
| CN | 206542378 U | 10/2017 |
| GB | 2488511 A | 9/2012 |

OTHER PUBLICATIONS

K. Okada and A. Matsuzawa, "Reconfigurable RF CMOS circuit design for cognitive radios," 2009 International SoC Design Conference (ISOCC), Busan, Korea (South), 2009, pp. 96-99, doi: 10.1109/SOCDC.2009.5423880.

*Primary Examiner* — John W Poos
(74) *Attorney, Agent, or Firm* — Patterson + Sheridan, LLP (57) ABSTRACT

Embodiments herein describe a self-biased divider for a clock in an integrated circuit. In one embodiment, the clock includes a VCO that generates a clock signal that is output to the self-biased divider. However, because the VCO may generate an analog clocking signal (e.g., a low amplitude sine wave of unknown common mode) to reduce jitter, the amplitude can vary which means it may not sufficiently track CMOS parameters. The clocking signals generated by the self-biased divider are used as feedback signals for DC biasing (or DC leveling). In this manner, the divider is referred to a self-biased divider since signals generated by the divider are used to perform DC biasing/leveling.

20 Claims, 7 Drawing Sheets

(56) References Cited

U.S. PATENT DOCUMENTS

| | | | |
|---|---|---|---|
| 8,674,730 B2 | 3/2014 | Holzleitner et al. | |
| 9,559,792 B1 | 1/2017 | Amir-Aslanzadeh et al. | |
| 10,547,315 B2 | 1/2020 | Choi et al. | |
| 2008/0001645 A1* | 1/2008 | Kuroki | H03K 5/1565 |
| | | | 327/231 |
| 2011/0080198 A1* | 4/2011 | Ohta | H02M 3/073 |
| | | | 327/157 |
| 2011/0234293 A1* | 9/2011 | Shanan | H03B 19/00 |
| | | | 327/361 |
| 2012/0328284 A1* | 12/2012 | Kawasaki | H04Q 11/0005 |
| | | | 398/25 |
| 2014/0070853 A1* | 3/2014 | Sankaran | H03K 21/026 |
| | | | 377/127 |

\* cited by examiner

HIGH FREQUENCY AC COUPLED SELF-BIASED DIVIDER

BACKGROUND

The present invention relates to a self-biased divider in a clock circuit.

Clock generation in an integrated circuit, such as a processor or an application specific integrated circuit (ASIC), often includes a divider for outputting different clocking frequencies. For example, high speed input/output (I/O) on the integrated circuit may require a different frequency from that generated by a voltage controlled oscillator (VCO) in the clock. The clock can use the divider to reduce (e.g., divide by two) the clock signal generated by the VCO before the clock signal is transmitted to the I/O circuitry. However, most clocks include leveling circuitry between the VCO and the divider. This leveling circuitry converts the AC signal generated by the VCO into a signal suitable for digital circuitry (e.g., complementary metal-oxide-semiconductor (CMOS) circuitry). However, this leveling circuitry (e.g., inverters or buffers) take up a significant amount of area and power. As such, there is a need to convert the clock signal into a suitable signal for digital circuitry while avoiding the drawbacks of leveling circuitry.

SUMMARY

According to one embodiment of the present invention, a circuit includes a clock generation circuit configured to generate a differential clocking signal, a pair of capacitors configured to receive the differential clocking signal, and a self-biased divider including inputs coupled to the pair of capacitors to receive the differential clocking signal, where the self-biased divider is configured to output a quadrature clocking signal where at least two clocking signals in the quadrature clocking signal are fed back to perform DC biasing on the differential clocking signal.

In addition, in one embodiment, the circuit includes feedback paths coupled to two outputs of the self-biased divider and respective ends of the pair of capacitors which, advantageously, performs DC biasing without the use of leveling circuitry.

In addition, in one embodiment, the feedback paths comprise respective resistors coupled at one ends to the outputs of the self-biased divider and at second ends to the pair of capacitors to perform DC biasing.

In addition, in one embodiment, first ends of the pair of capacitors are coupled to both the feedback paths and the inputs to self-biased divider and second ends of the pair of capacitors are coupled to the clock generation circuit to perform DC biasing.

In addition, in one embodiment, the two clocking signals used for DC biasing have a phase offset of 180 degrees. Advantageously, different pairs of the quadrature clock can be used if these signals have a phase offset of 180 degrees.

In addition, in one embodiment, there are no inverters disposed between the pair of capacitors and the inputs of the self-biased divider. Advantageously, removing inverters (or any other leveling circuitry) can reduce the footprint and the power consumption of the circuit.

Another embodiment of the present invention is an integrated circuit that includes a clock generation circuit configured to generate an analog clocking signal, a pair of capacitors configured to receive the analog clocking signal, and a self-biased divider including inputs coupled to the pair of capacitors to receive the analog clocking signal, where the self-biased divider is configured to output a quadrature clocking signal where at least two clocking signals in the quadrature clocking signal are fed back to perform DC biasing on the analog clocking signal.

Another embodiment of the present invention is a method that includes AC coupling a differential clocking signal to a pair of capacitors, receiving the AC coupled clocking signal at a self-biased divider coupled to the pair of capacitors, outputting a quadrature clocking signal using the self-biased divider, and feeding back at least two clocking signals in the quadrature clocking signal to perform DC biasing at the pair of capacitors.

DETAILED DESCRIPTION

Embodiments herein describe a self-biased divider for a clock in an integrated circuit. In one embodiment, the clock includes a VCO that generates a clock signal that is output to the self-biased divider. However, because the VCO may generate an analog clocking signal (e.g., a sine wave) to reduce jitter, the amplitude can vary which means it may not sufficiently track CMOS parameters. As mentioned above, leveling circuitry can be disposed between the VCO and the divider in order to make the clocking signal suitable for digital circuitry (e.g., CMOS circuitry). The leveling circuitry can form a feedback DC biasing signal for the clocking signal.

However, in the embodiments herein, the leveling circuitry (e.g., inverters or buffers) is removed and signals from the divider are used as feedback signals for DC biasing (or DC leveling). In this manner, the divider is referred to a self-biased divider since signals generated by the divider are used to perform DC biasing/leveling. As a result of implementing a self-biased divider, the integrated circuit saves area and power by omitting the leveling circuitry.

Figure 1:
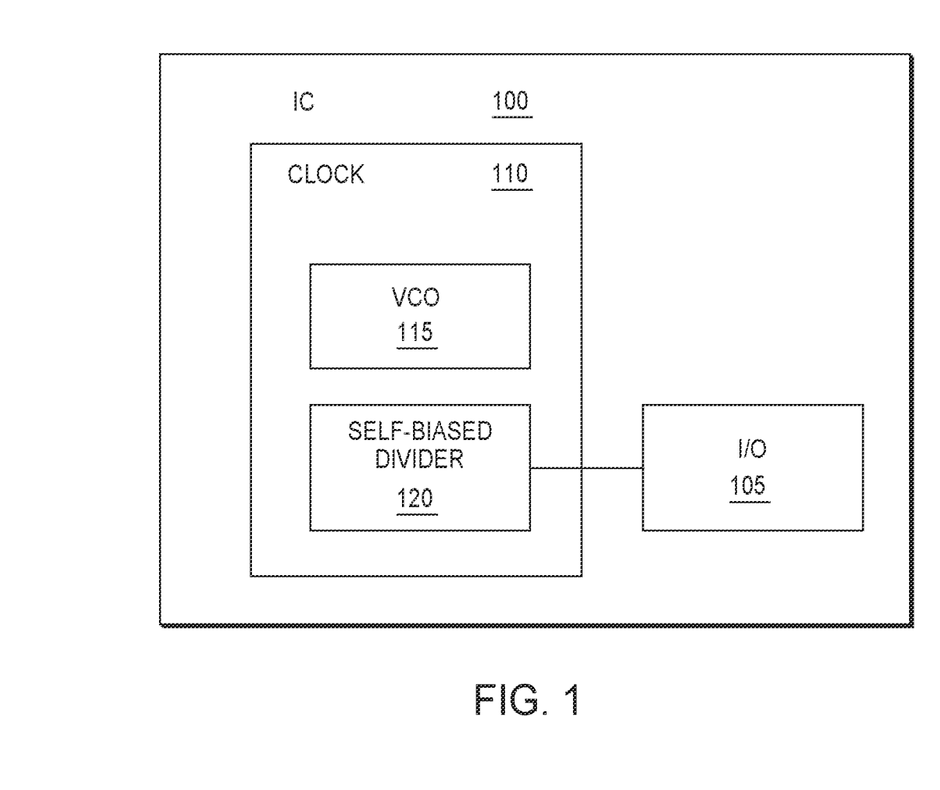
FIG. 1 illustrates an integrated circuit with a self-biased divider, according to one example.

FIG. 1 illustrates an integrated circuit (IC) 100 with a self-biased divider 120, according to one example. The IC 100 can be any semiconductor material which has been processed to include electrical circuitry. The embodiments herein are not limited to any particular type of semiconductor (e.g., silicon) or IC 100. For example, the IC 100 can include a processor (e.g., central processing unit), ASIC, system on a chip (SOC), field programmable gate array (FPGA), and the like.

In this example, the IC 100 includes I/O 105 (e.g., I/O circuitry) that permits the IC 100 to communicate with external systems such as another IC, a bus, motherboard, and the like. The I/O 105 is not limited to any particular communication protocol but could be PCIe, OpenCAPI, and the like.

The IC 100 includes a clock 110 for providing a clocking signal to the I/O 105. The clock 110 includes a VCO 115 and self-biased divider 120. The VCO 115 generates a clocking signal (e.g., an analog clocking signal) that is then provided to the self-biased divider 120. Although not shown, the VCO 115 can include an oscillator and other circuitry (e.g., capacitors and inductors) to generate a clocking signal (e.g., a 8 GHz, 16 GHz, 32 GHz, etc.). In any case, the embodiments herein are not limited to any particular type of VCO circuit. Further still, the embodiments herein can be used with any clock generation circuit that generates a clocking signal, whether it is a VCO, phase locked loop (PLL), or some other type of clock generation circuit.

The self-biased divider 120 is used to reduce the frequency of the clocking signal generated by the VCO 115. For example, the I/O 105 may operate in different modes where in one mode the I/O 105 operates at the same frequency as the clocking signal generated by the VCO 115 (e.g., without dividing the clocking signal) but in another mode the I/O 105 operates at a reduced frequency clocking signal. For example, the VCO 115 may be designed to generate a clocking signal at a single frequency (e.g., 32 GHz), but with the use of the self-biased divider 120, the clocking signal can be divided to a frequency that matches the current mode of the I/O 105 (e.g., 16 GHz or 8 GHz). In this manner, the divider 120 can provide flexibility to the clock 110.

As described in more detail in the figures below, the divider 120 is self-biased. That is, signals generated by the clock are used as feedback to provide a DC bias or level for the signals being input into the divider 120. This can be used to eliminate or reduce the amount of separate leveling circuitry in the clock, which can save power and area.

While FIG. 1 illustrates a clock 110 for I/O 105, the clock 110 can provide a clocking signal to any circuitry in the IC 100. More generally, the embodiments herein can be used in any clock that can benefit from having a self-biased divider 120, regardless of the circuitry the clock is connected to.

Figure 2:
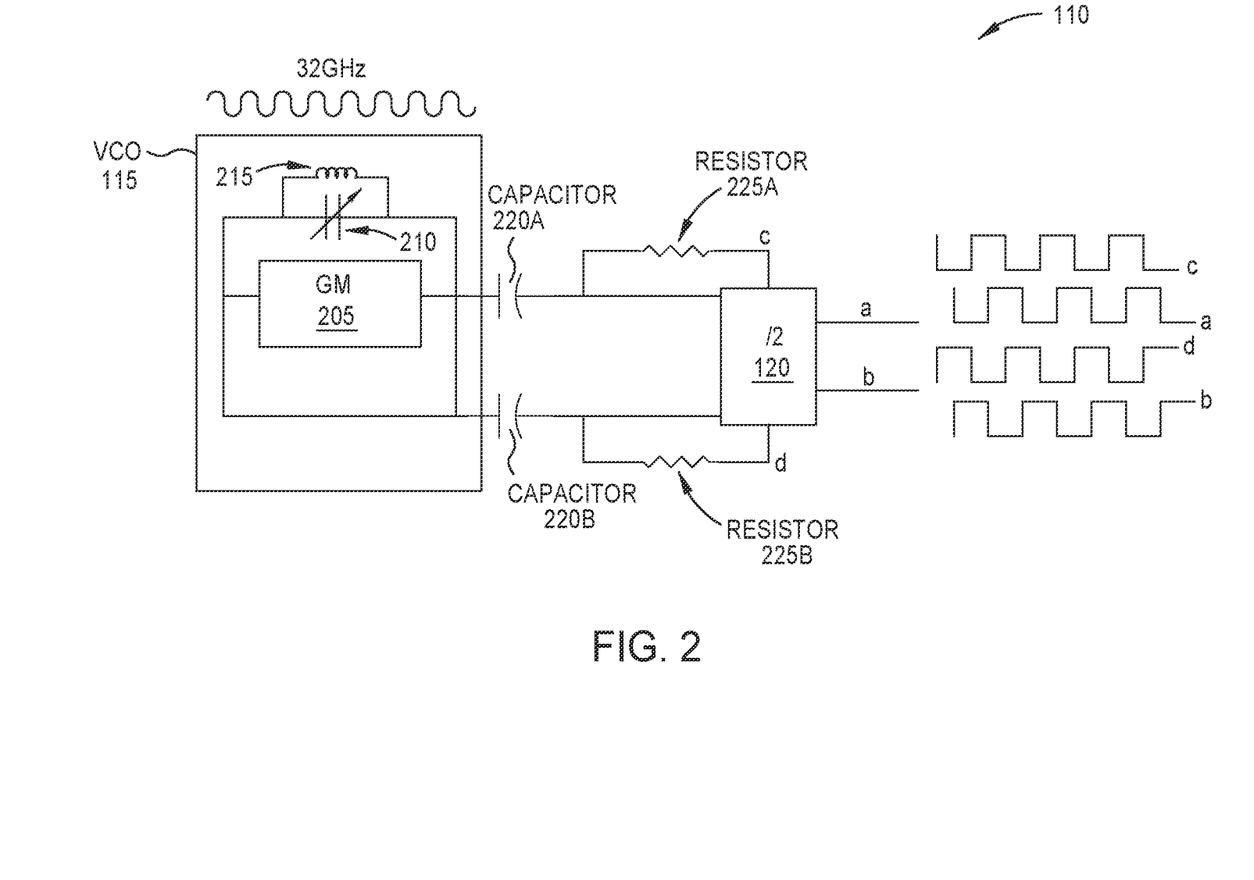
FIG. 2 illustrates circuitry for a clock including a self-biased divider, according to one example.

FIG. 2 illustrates circuitry for the clock 110 that includes the self-biased divider 120, according to one example. The clock 110 includes the VCO 115 which in turn includes a negative transconductance (GM) cell 205, variable capacitor 210, and an inductor 215. The capacitor 210 and the inductor 215 are in parallel and form an LC tank circuit for the VCO 115. The GM cell 205 outputs a differential clocking signal (e.g., a differential sine wave) to the downstream circuitry in the clock 110. However, FIG. 2 is just one example of a VCO 115 design, and is not intended to be limiting. In general, the self-biased divider 120 can be coupled to any clock generation circuit, which can include a PLL or other circuit elements. For example, the VCO 115 may be part of a PLL.

The VCO 115 is coupled to AC coupling capacitors 220. That is, the VCO 115 (and the clocking signal it generates) is AC coupled to the capacitors 220. This means the clocking signal should be DC biased (or leveled) at a node to the right of the capacitors 220. Further, the amplitude of an analog clocking signal can vary widely (e.g., from 300 mVpp to 1V pp) which makes it difficult to transmit using CMOS or current-mode logic (CML) digital circuitry forming the divider 120 and the rest of the clocking network. As such, the amplitude of the clocking signal generated by the VCO 115 should be harmonized with the downstream CMOS or CML circuitry.

To do so, the clock 110 includes resistors 225 that form feedback paths from the divider 120 to the right ends of the capacitors 220. The feedback signals generated by the divider 120 (labeled C and D) harmonize the amplitude of the clocking signal. In one embodiment, the feedback signals bias the clocking signal at half of a voltage power supply, which is the threshold for CMOS switching.

The outputs of the divider 120 (labeled A, B, C, and D) generate a quadrature clocking signal with a frequency that is reduced relative to the frequency of the clocking signal generated by the VCO 115. In this example, each of the four outputs of the divider A-D are half the frequency (e.g., 16 GHz) of the clocking signal generated by the VCO 115 (e.g., 32 GHz). Moreover, each of the four outputs have a 90 degree phase offset from each other. That is, output A is 90 degree phase shifted from outputs C and D, output B is 90 degree phase shifted from outputs C and D, output C is 90 degree phase shifted from outputs A and B, and output D is 90 degree phase shifted from outputs A and B. As a result, outputs A and B are 180 degrees offset from each other and outputs C and D are 180 degrees offset from each other.

Further, in this example, the outputs C and D are also used as feedback signals to perform DC biasing to harmonize the amplitude of the clocking signal received at the input of the divider 120. That is, rather than using outputs of leveling circuitry that would be disposed between the capacitors 220 and the input of the divider 120 to perform DC biasing, the outputs C and D can be dual purposed as the feedback signals and as outputs for the quadrature clock signal. Further, in another embodiment, the outputs A and B could instead be used as the feedback signals rather than the outputs C and D.

Although not shown, the quadrature clocking signal is provided to downstream circuitry connected to the clock 110, such as the I/O 105 in FIG. 1. In this manner, the divider 120 can be used to reduce the frequency of the clock generated by the VCO as well as provide its own feedback signals for DC biasing/leveling.

Figure 3A:
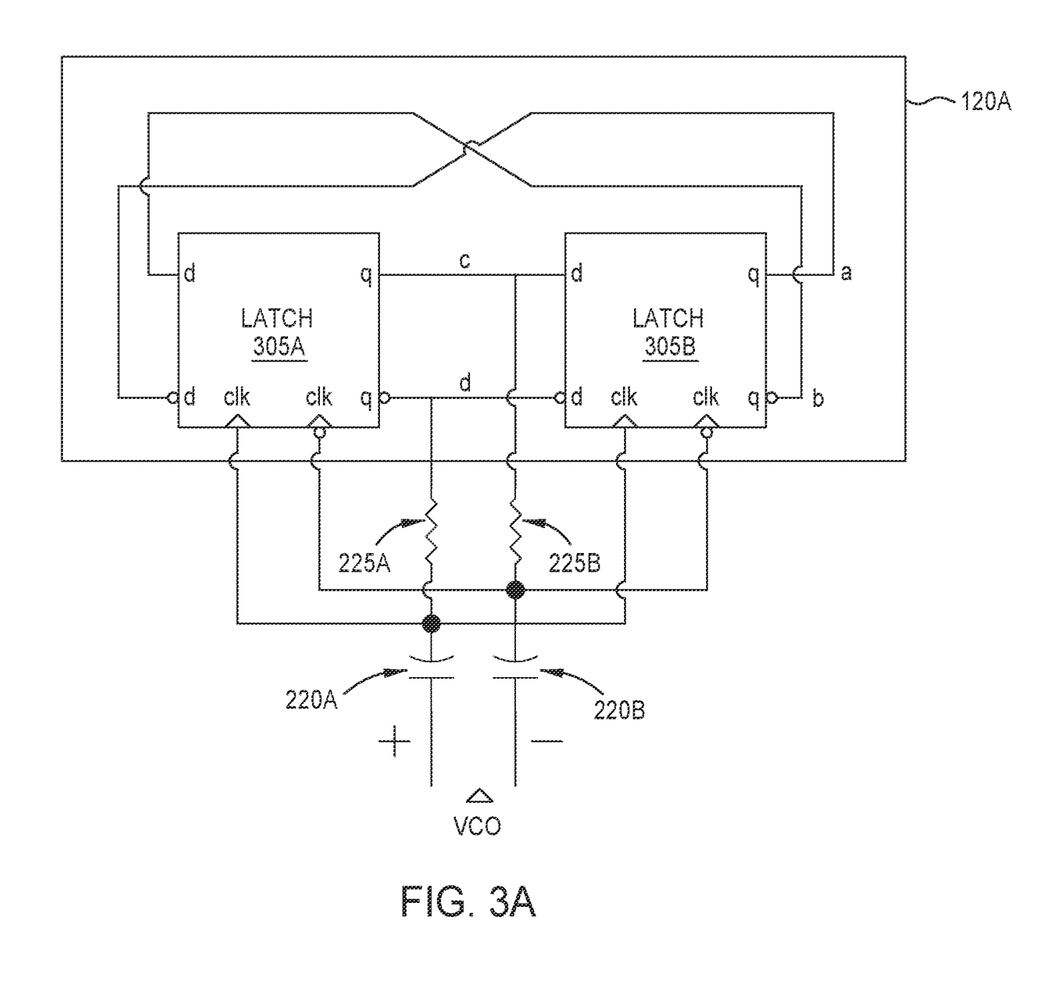
FIGS. 3A and 3B illustrate self-biased dividers, according to one example.
Figure 3B:
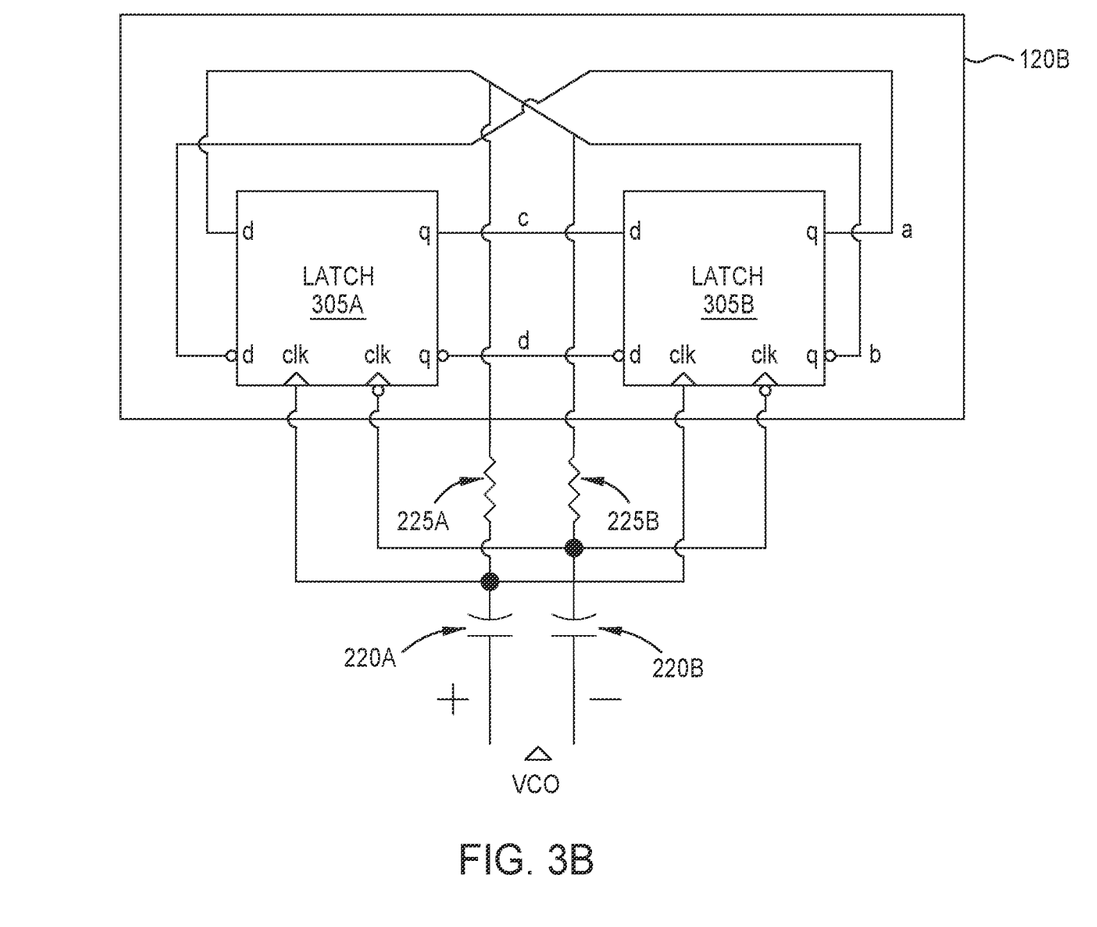

FIGS. 3A and 3B illustrate self-biased dividers, according to one example. Specifically, FIG. 3A illustrates a self-biased divider 120A where the outputs C and D are used as the feedback signals (similar to FIG. 2) while FIG. 3B illustrates a self-biased divider 120B where the outputs A and B are instead used as the feedback signals for performing DC biasing.

Both FIGS. 3A and 3B illustrate dividers 120 that have two latches: latch 305 and 305B. The inputs of the latches 305 are connected to the capacitors 220 to receive the differential clocking signal. Further, the latches 305 are coupled to each other using four connections where these connections can be tapped to generate the outputs A-D. Further, in FIG. 3A, the outputs C and D are connected to the resistors 225 on one end while the other end of the resistors 225 is coupled to the capacitors 220. However, in FIG. 3B, the outputs A and B are instead connected to the resistors 225 on one end while the other end of the resistors 225 is coupled to the capacitors 220. Thus, the only difference between FIGS. 3A and 3B is whether the outputs C and D or the outputs A and B are coupled to the resistors 225 and are used as feedback signals.

Figure 4:
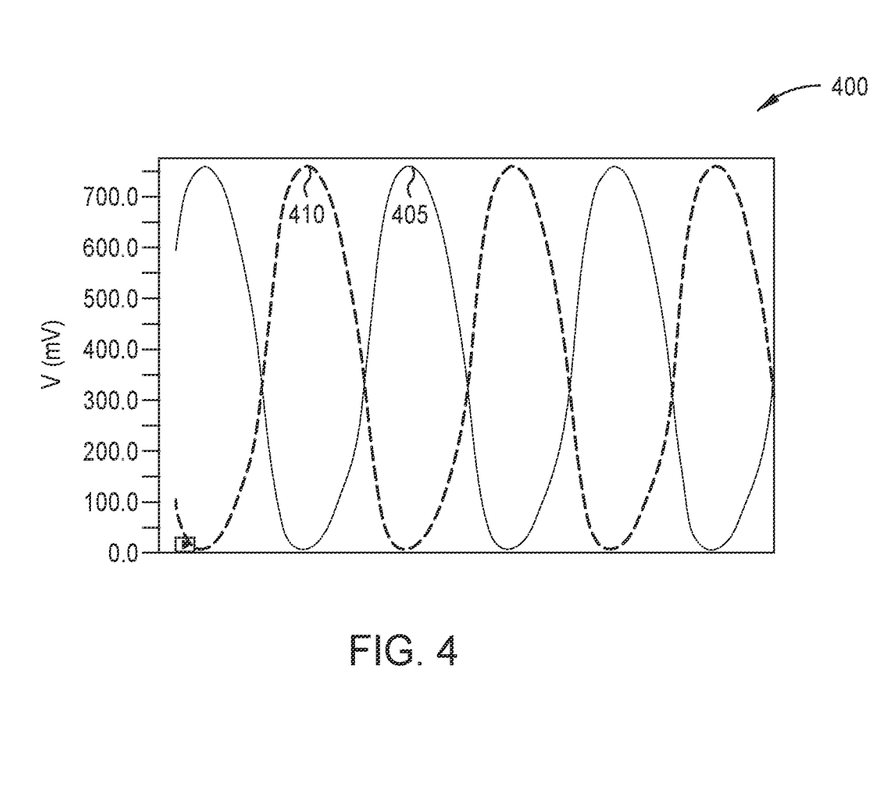
FIG. 4 is a chart illustrating a differential clocking signal, according to one example.

FIG. 4 is a chart 400 illustrating a differential clocking signal, according to one example. Specifically, the lines 405 and 410 in the chart 400 are the differential clocking signals inputted into the self-biased dividers discussed above. As the chart 400 illustrates, the self-biasing performed by the divider results in a well-shaped differential clock signal that can be used as an input to the divider. Thus, replacing the leveling circuitry with a self-biased divider does not have a detrimental effect on the clocking signal.

Figure 5:
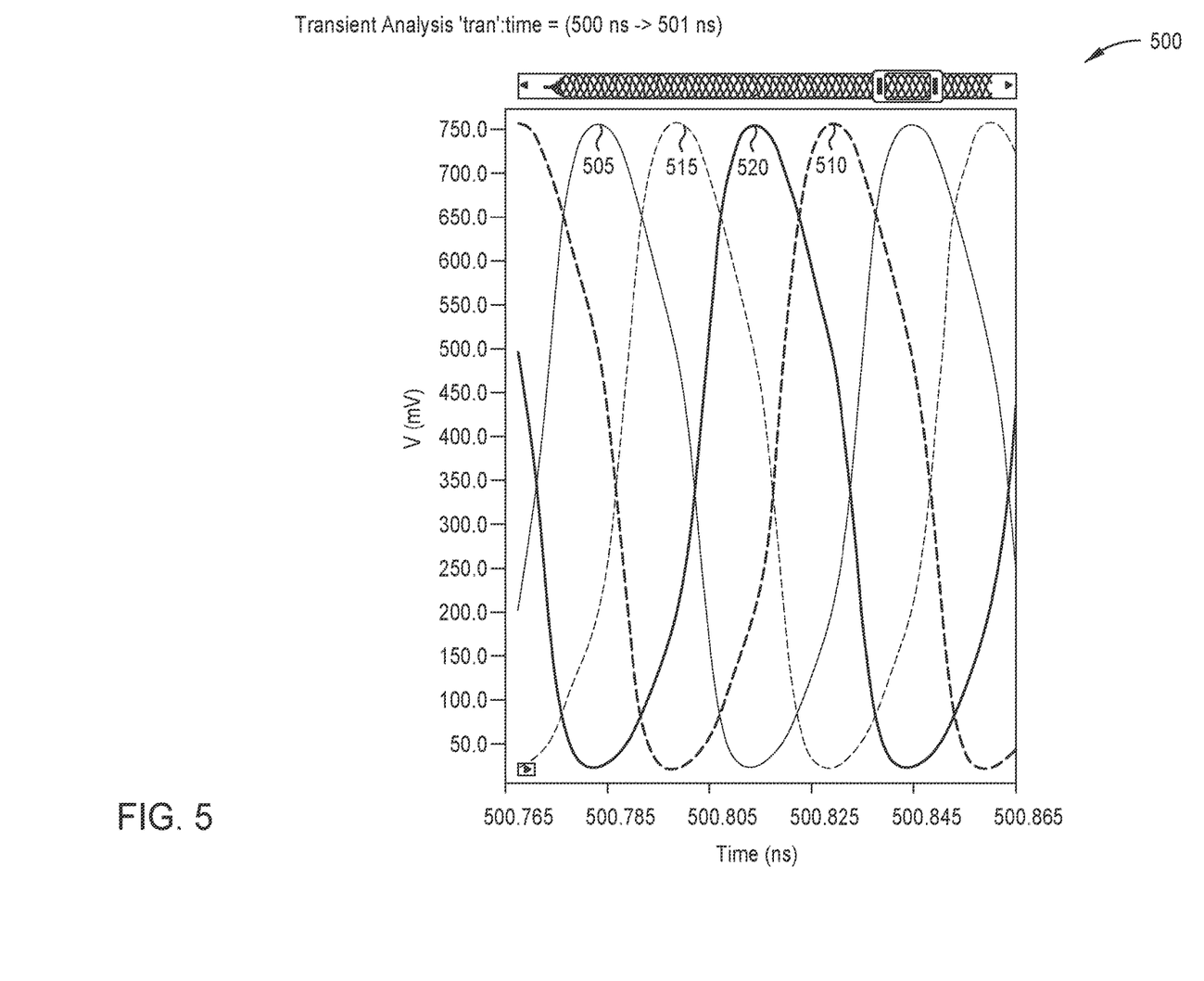
FIG. 5 is a chart illustrating a quadrature clocking signal, according to one example.

FIG. 5 is a chart illustrating a quadrature clocking signal, according to one example. Here, the lines 505, 510, 515, and 520 illustrate the four outputs A-D generated by the self-biased dividers discussed above.

Figure 6:
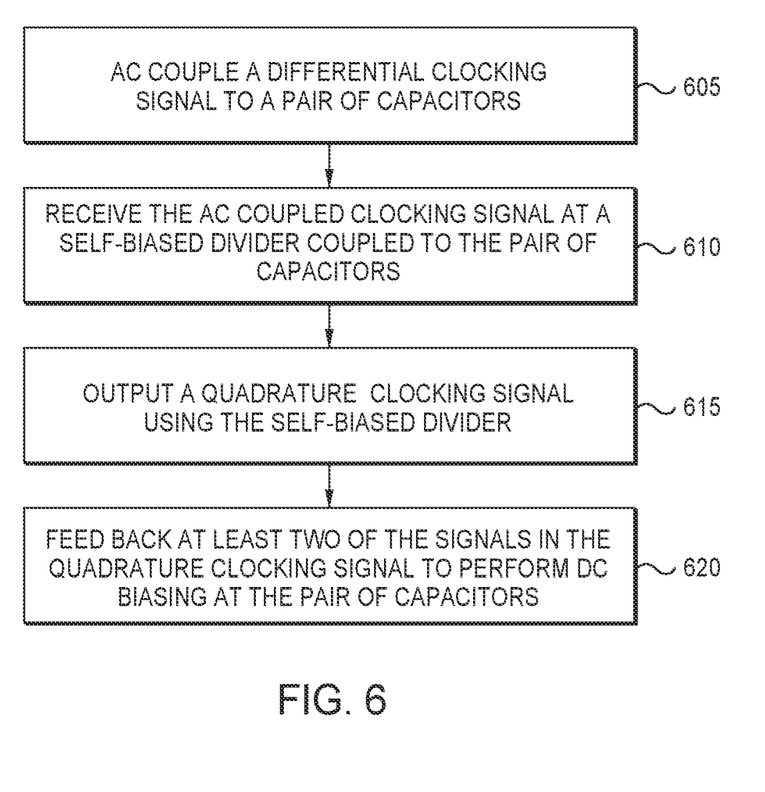
FIG. 6 is a flowchart for operating a self-biased divider in a clock, according to one example.

FIG. 6 is a flowchart of a method 600 for operating a self-biased divider in a clock, according to one example. At block 605, a clock generation circuit (e.g., a VCO or PLL) generates a differential clocking signal that is AC coupled to a pair of capacitors (e.g., the AC coupling capacitors 220A and 220B in FIG. 2). In one embodiment, the clock generation circuit generates an analog clocking signal (e.g., a sine wave) where the amplitude can vary which means it may not sufficiently track CMOS or CML parameters. The method 600 can be used to provide a DC bias or leveling to harmonize the amplitude of the clocking signal to CMOS or CIVIL parameters.

At block 610, a self-biased divider receives the AC coupled clocking signal. That is, an input of the self-biased divider is coupled to the pair of capacitors so that the clocking signal generated by the clock generation circuit is input into the self-biased divider.

At block 615, the self-biased divider outputs a quadrature clocking signal. In one embodiment, the quadrature clocking signal includes four clocking signals with 90 degree phase offsets relative to each other (see FIG. 5).

At block 620, the self-biased divider feed backs at least two of the clocking signals in the quadrature clocking signal to perform DC biasing at the pair of capacitors. In one embodiment, these two clocking signals are 180 degrees offset from each other. Further, in one embodiment, the two clocking signals are fed back in respective paths that include at least one resistor. Because signals generated by the divider are used to perform DC biasing/leveling for the clocking signal being input into the divider, the divider is referred to as a self-biased divider.

In the preceding, reference is made to embodiments presented in this disclosure. However, the scope of the present disclosure is not limited to specific described embodiments. Instead, any combination of the features and elements, whether related to different embodiments or not, is contemplated to implement and practice contemplated embodiments. Furthermore, although embodiments disclosed herein may achieve advantages over other possible solutions or over the prior art, whether or not a particular advantage is achieved by a given embodiment is not limiting of the scope of the present disclosure. Thus, the aspects, features, embodiments and advantages discussed herein are merely illustrative and are not considered elements or limitations of the appended claims except where explicitly recited in a claim(s). Likewise, reference to "the invention" shall not be construed as a generalization of any inventive subject matter disclosed herein and shall not be considered to be an element or limitation of the appended claims except where explicitly recited in a claim(s).

Aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system."

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be accomplished as one step, executed concurrently, substantially concurrently, in a partially or wholly temporally overlapping manner, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

While the foregoing is directed to embodiments of the present invention, other and further embodiments of the invention may be devised without departing from the basic scope thereof, and the scope thereof is determined by the claims that follow.

What is claimed is:

1. A circuit, comprising:
a clock generation circuit configured to generate a differential clocking signal;
a pair of capacitors configured to receive the differential clocking signal; and
a self-biased divider comprising inputs coupled to the pair of capacitors to receive the differential clocking signal, wherein the self-biased divider is configured to output a quadrature clocking signal where at least two clocking signals in the quadrature clocking signal are fed back to perform DC biasing on the differential clocking signal.

2. The circuit of claim 1, further comprising:
feedback paths coupled to two outputs of the self-biased divider and respective ends of the pair of capacitors.

3. The circuit of claim 2, wherein the feedback paths comprise respective resistors coupled at one ends to the outputs of the self-biased divider and at second ends to the pair of capacitors.

4. The circuit of claim 3, wherein first ends of the pair of capacitors are coupled to both the feedback paths and the inputs to self-biased divider and second ends of the pair of capacitors are coupled to the clock generation circuit.

5. The circuit of claim 1, wherein the two clocking signals have a phase offset of 180 degrees.

6. The circuit of claim 1, wherein a frequency of the quadrature clocking signal is reduced relative to a frequency of the differential clocking signal by a power of two.

7. The circuit of claim 1, wherein there are no inverters disposed between the pair of capacitors and the inputs of the self-biased divider.

8. An integrated circuit (IC) comprising:
a clock generation circuit configured to generate an analog clocking signal;
a pair of capacitors configured to receive the analog clocking signal; and
a self-biased divider comprising inputs coupled to the pair of capacitors to receive the analog clocking signal, wherein the self-biased divider is configured to output a quadrature clocking signal where at least two clocking signals in the quadrature clocking signal are fed back to perform DC biasing on the analog clocking signal.

9. The IC of claim 8, further comprising:
feedback paths coupled to two outputs of the self-biased divider and respective ends of the pair of capacitors.

10. The IC of claim 9, wherein the feedback paths comprise respective resistors coupled at one ends to the outputs of the self-biased divider and at second ends to the pair of capacitors.

11. The IC of claim 10, wherein first ends of the pair of capacitors are coupled to both the feedback paths and the inputs to self-biased divider and second ends of the pair of capacitors are coupled to the clock generation circuit.

12. The IC of claim 8, wherein the two clocking signals have a phase offset of 180 degrees.

13. The IC of claim 8, wherein a frequency of the quadrature clocking signal is reduced relative to a frequency of the analog clocking signal by a power of two.

14. The IC of claim 8, wherein there are no inverters disposed between the pair of capacitors and the inputs of the self-biased divider.

15. A method comprising:
AC coupling a differential clocking signal to a pair of capacitors;
receiving the AC coupled clocking signal at a self-biased divider coupled to the pair of capacitors;
outputting a quadrature clocking signal using the self-biased divider; and
feeding back at least two clocking signals in the quadrature clocking signal to perform DC biasing at the pair of capacitors.

16. The method of claim 15, wherein the two clocking signals are fed back using feedback paths coupled to two outputs of the self-biased divider and respective ends of the pair of capacitors.

17. The method of claim 16, wherein the feedback paths comprise respective resistors coupled at one ends to outputs of the self-biased divider and at second ends to the pair of capacitors.

18. The method of claim 17, wherein first ends of the pair of capacitors are coupled to both the feedback paths and the inputs to self-biased divider and second ends of the pair of capacitors are coupled to the clock generation circuit.

19. The method of claim 15, wherein the two clocking signals have a phase offset of 180 degrees.

20. The method of claim 15, wherein there are no inverters disposed between the pair of capacitors and inputs of the self-biased divider.

\* \* \* \* \*